Figure 1:
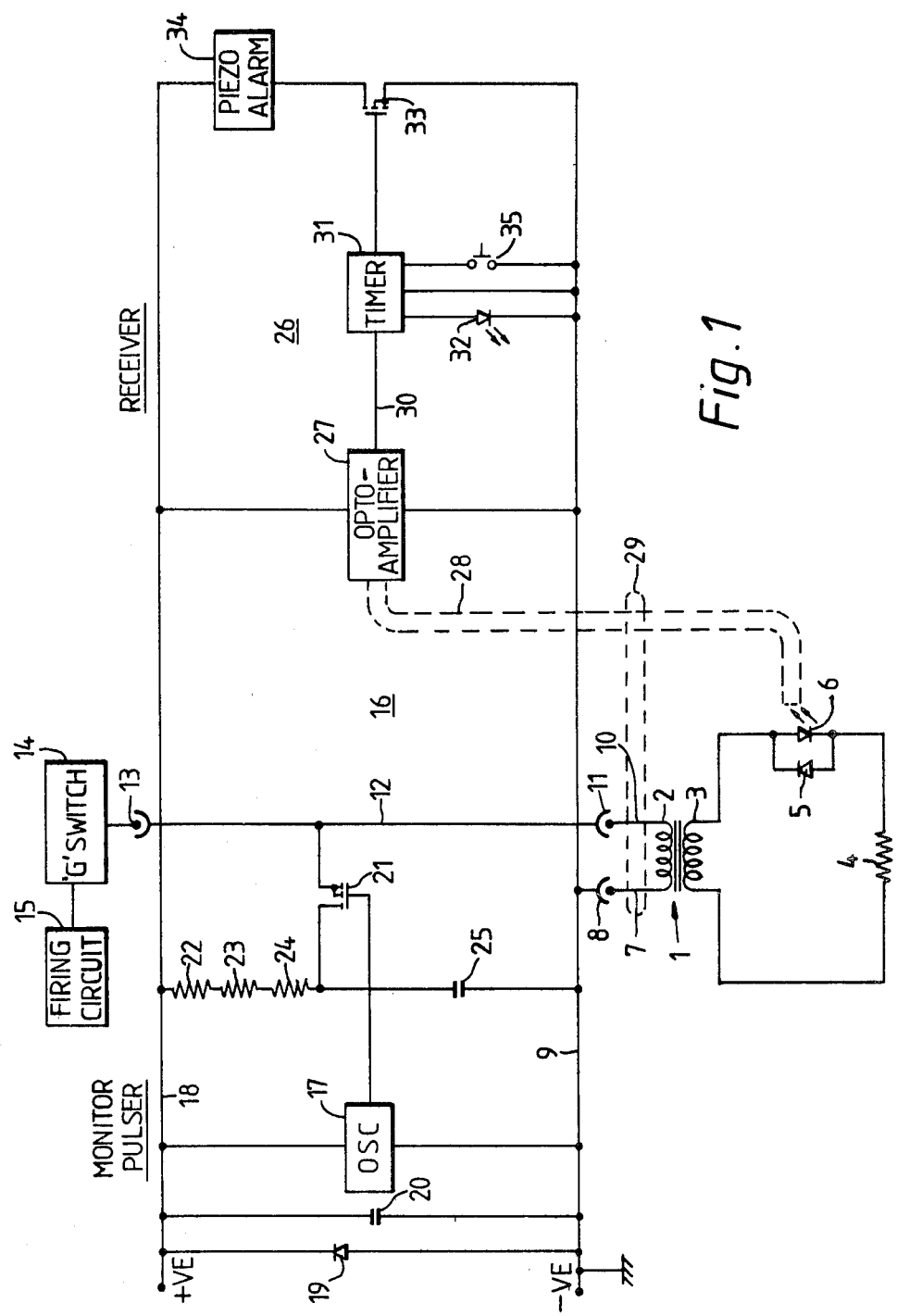

United States Patent [19]

Sellwood

[11] 4,414,901
[45] Nov. 15, 1983

[54] EXPLOSIVE DEVICE INCLUDING AN IGNITION CIRCUIT MONITOR

[75] Inventor: Raymund E. Sellwood, Slough, England

[73] Assignee: M.L. Aviation Company Limited, Slough, England

[21] Appl. No.: 274,739

[22] Filed: Jun. 18, 1981

[30] Foreign Application Priority Data

Mar. 9, 1981 [GB] United Kingdom ............... 8107359

[51] Int. Cl.$^3$ ............................................ F42C 11/00
[52] U.S. Cl. .................................................. 102/206
[58] Field of Search .............. 102/206, 200, 217, 218, 102/219, 220, 215; 361/248, 251; 116/202; 280/728, 734, 735

[56] References Cited

U.S. PATENT DOCUMENTS

| | | | |
|---|---|---|---|
| 3,675,578 | 7/1972 | Douglas et al. | 102/206 |
| 3,762,331 | 10/1973 | Vlahos | 102/218 |
| 3,834,313 | 9/1974 | Sato | 102/215 |
| 4,044,681 | 8/1977 | de Mere | 102/206 |
| 4,089,035 | 5/1978 | Smith | 102/218 |
| 4,141,297 | 2/1979 | Sellwood | 102/206 |

*Primary Examiner*—Charles T. Jordan
*Attorney, Agent, or Firm*—Kemon & Estabrook

[57] ABSTRACT

An explosive device comprises a charge of explosive material which can be fired by feeding power from a firing circuit to an igniter circuit which includes an electrically-energizable fuse. In order to check the integrity of the igniter circuit, a monitoring circuit feeds a continuous stream of electrical pulses to the fuse circuit at such a low energy level that the pulses cannot cause ignition of the explosive charge, but they are sufficient to cause a light-emitting diode to emit short bursts of light. The production of these bursts is monitored by a receiver circuit via an optical fibre, and provided that corresponding signals are received continuously by a timer, a lamp indicates that the igniter circuit is ready for operation. If there is a break in the received signals, for example due to open-circuiting of the fuse, an alarm is operated. The connections between the igniter circuit and the monitoring circuit may be made via a demountable transformer.

6 Claims, 3 Drawing Figures

EXPLOSIVE DEVICE INCLUDING AN IGNITION CIRCUIT MONITOR

This invention relates to ignition circuits for explosive devices of the kind having an electrically-energised heating element for igniting the explosive.

Such explosive devices are commonly used for actuating or releasing mechanisms, such as, for example, release mechanisms for ejector seats, safety air bag inflators or emergency brake systems in aircraft. It is, of course, absolutely essential that such mechanisms shall fire reliably when called upon to do so by application of a command signal to the ignition circuit.

In our British Patent Specification No. 1,235,844 there is disclosed an ignition circuit for an explosive device which comprises, besides the explosive charge, an electrical heating element for igniting the charge and a transformer secondary winding located on a magnetic core and connected to the element. The device is received by a holder which contains a transformer primary winding located on a second magnetic core and which becomes inductively linked with the secondary winding by proximity of the two cores, so that energisation of the primary winding by an oscillator induces a current in the secondary winding which energises the heating element and ignites the charge. The cores are preferably pot cores which completely enclose the windings and thereby shield them from spurious radio frequency signals. In order to initiate firing of the charge, the oscillator is energised by merely feeding a d.c. supply to the oscillator.

In our British Patent Specification No. 1,520,036 an alternative ignition circuit is disclosed in which an inhibiting circuit is provided to inhibit operation of the oscillator until a trigger signal is fed to the inhibiting circuit to cancel the inhibition.

In a further alternative ignition circuit the transformer which couples the heating element to the oscillator in the above-mentioned arrangements could be omitted, and the element and the oscillator could be coupled together via a filter which removes any spurious radio-frequency signals from the igniter circuit.

Clearly, however reliable and safe the firing circuit may be, the explosive device will be absolutely useless if the heating element is open-circuit or disconnected from the firing circuit.

It is an object of the present invention to provide an improved ignition circuit for an explosive device, in which the integrity of the circuit can be continuously monitored.

According to the present invention, an explosive device comprises an explosive charge; an igniter circuit including an electrically-energisable heating element for igniting the explosive charge; a firing circuit operable to feed electrical energy to the igniter circuit at a firing level sufficient to cause ignition of the explosive charge; and a monitoring circuit operable to feed electrical energy to the igniter circuit at a level less than said firing level and to monitor radiant energy produced thereby in the igniter circuit in order to check the integrity of the igniter circuit.

Figure 2:
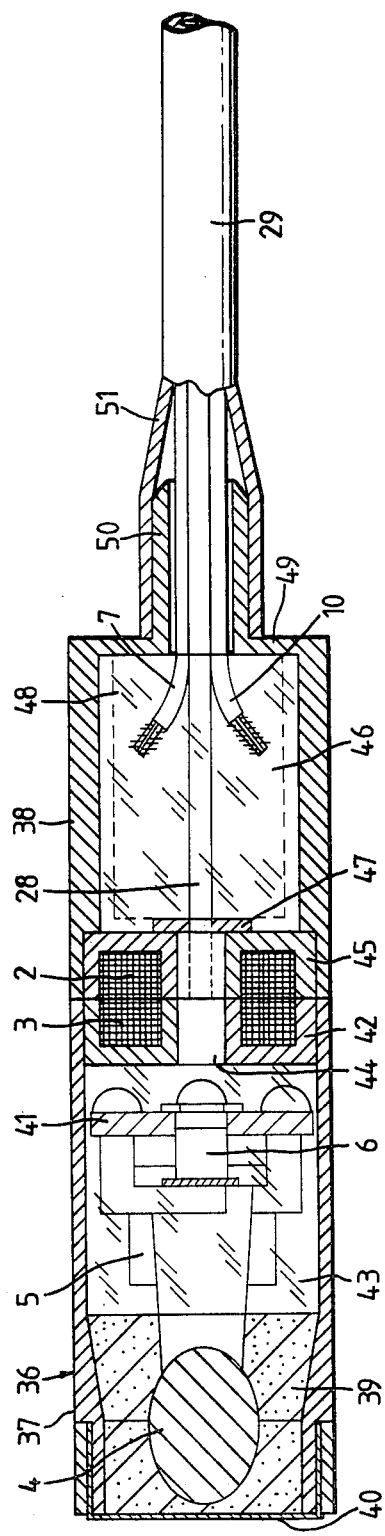
Figure 3:
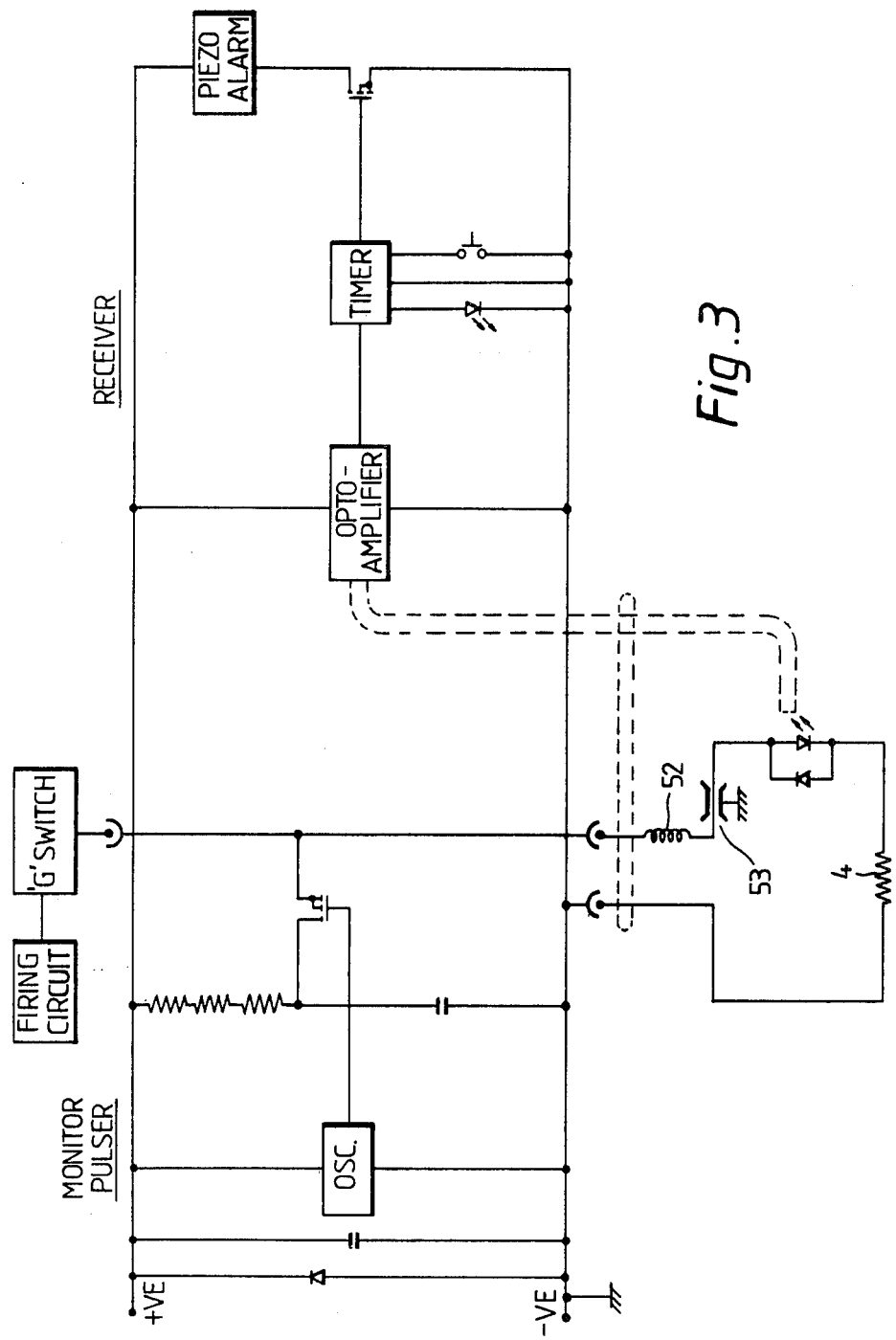

Embodiments of the invention will now be described, by way of example, with reference to the accompanying drawings, in which:

FIG. 1 is a block schematic diagram of one configuration of an ignition monitoring circuit forming part of an explosive device in accordance with the invention, FIG. 2 is a longitudinal cross-section through a combination of an explosive charge and a transformer of the ignition circuit, and FIG. 3 is a block schematic diagram of another ignition monitoring circuit configuration.

Referring to FIG. 1, a saturable ferrite core transformer 1 has a primary winding 2 an a secondary winding 3. The secondary winding 3 is connected to a heating element 4 of an explosive fuze via a parallel circuit comprising a diode 5 and a light-emitting diode (LED) 6. One side of the primary winding 2 is connected, via a line 7 and a connector 8, to a grounded line 9. The other side of the winding is connected, via a line 10, a connector 11, a line 12, a connector 13 and a G-switch 14, to a firing circuit 15. When the firing circuit is operated, it produces an output at, say, 20/50 KHz which is fed to the primary winding 2, when the switch 14 is closed, and hence to the secondary winding 3. The ratio of secondary turns to primary turns is chosen to give the level of heater current required for igniting the particular explosive device which is being used.

The firing circuit 15 may be, for example, a circuit such as described in the above-mentioned British Patent Specification No. 1,520,036.

A monitoring circuit 16 for checking the integrity of the transformer and of the fuze circuit comprises an oscillator 17 which is energised from positive and negative d.c. supply lines 18 and 9, respectively. The d.c. supply is stabilised and decoupled by a zener diode 19 and a capacitor 20. The oscillator 17 feeds gating pulses to a field-effect transistor 21 which has its source electrode connected to the positive line 18 via three high-reliability resistors 22, 23 and 24 connected in series. A capacitor 25 is connected between the source electrode and the ground line 9. The drain electrode of the transistor 21 is connected to the line 12.

In operation of this part of the circuit, the capacitor 25 charges from the d.c. supply via the resistors 22 to 24. The oscillator 17 feeds a firing pulse to the FET 21 which conducts, thereby discharging the capacitor 25, via the line 12, into the transformer primary winding 2. This causes a current to flow through the fuze 4 and the LED 6, so that the LED emits a very short burst of infra-red light. The capacitor 25 recharges, and is again discharged upon receipt of the next oscillator pulse by the FET 21.

The operating frequency of the oscillator 17 and the values of the resistors 22 to 24 are chosen such that the energy fed into the fuze circuit is far below the level required for the fuze to fire the explosive device, but is sufficient to cause flashing of the LED 6. The flashes may have, for example, a duration of 5 microseconds and a repetition rate of one every 5 seconds. High-reliability components are used for the resistors 22 to 24 to ensure that their values remain constant, but the triplication of the resistors is an added safeguard just in case any one of the resistors should become low-resistance, and ensures that the energy stored in the capacitor 25 cannot, under any operational conditions, approach the firing level for the fuze 4.

It will be apparent that if the fuze 4 or any part of its circuit becomes open-circuited, or if the windings 2 and 3 of the demountable transformer become separated, or if any part of the monitoring circuit becomes inoperative, the LED 6 will stop flashing, or will flash at an incorrect rate, depending upon the nature of the circuit disorder.

The operation of the LED 6 is monitored by a receiver 26 which comprisdes an opto-amplifier 27 which is coupled to the LED via a fibre optic light guide 28. As will be described later, the fibre optic 28 may conveniently be contained, together with the lines 7 and 10, in a cable 29 which connects the explosive device to the firing and monitoring circuits.

The opto-amplifier receives pulses of infra-red radiation from the LED 6, via the fibre optic 28, and produces a corresponding train of electrical signals, which are fed via a line 30 to a timer 31. Provided that the timer continues to receive signals from the opto-amplifier at regular intervals, it will merely light a lamp 32 to indicate that the circuitry of the LED 6 is operating properly. On the other hand, if the timer 31 does not receive the expected signals from the opto-amplifier 27 it will extinguish the lamp 32 and will cause conduction of a field-effect transistor 33 which will energise an audible alarm 34, such as a piezo-electric device. A "push-to-test" button 35 is provided for checking the timer operation.

In an alternative circuit, the LED 6 might be omitted and radiant energy produced in the fuze 4, itself, due to the monitoring current pulses flowing therethrough, might be monitored via the fibre optic 28.

FIG. 2 of the drawings shows a cross-section through a unit comprising an explosive device and certain parts of the circuit of FIG. 1. A cylindrical stainless steel case 36 is formed in two abutting sections 37 and 38. The section 37 contains the fuze 4 around which explosive material 39 is packed. The material is retained in the case section 37 by a metal foil diaphragm 40 which seals the end of the section. The LED 6, such as a P-N gallium arsenide device, is mounted on a printed circuit board 41 which also has conductors for connection to the diode 5 and to the transformer secondary winding 3. The winding 3 has a ferrite pot core 42.

The assembly of the transformer secondary winding 3, the core 42, the printed circuit board 41, the diode 5 and the diode 6 is encapsulated in a transparent material 43. The material also fills the central aperture in the core 42, forming a spigot 44 which acts as a light guide for light emitted by the diode 6.

The case section 38 contains the primary winding 2 and its associated ferrite pot core half 45. The ends of the lines 7 and 10 are terminated on thick-film circuitry 46, which connects the lines to the primary winding 2. The fibre optic 28 extends out of the cable 29, runs along the axis of the case section 38 and terminates in the central aperture of the core 42, where it is located by a ferrule 47. The extreme end of the fibre optic butts against the end surface of the spigot 44. The transformer primary winding 3, the core 45, the circuitry 46, the fibre optic 28, and the terminations of the lines 7 and 10 are all encapsulated in a resin material 48. The end 49 of the case section 38 is provided with a boss 50 though which the lines 7 and 10 and the fibre optic 28 pass, and over which the end of an insulating outer sheath 51 of the cable 29 is stretched.

The case sections 37 and 38 are held firmly together in axial alignment by means which are not shown in the drawings, so that the pot core halves 42 and 45 are in close contact, as are the end surfaces of the fibre optic 28 and the spigot 44. However, the case sections can be readily separated, so that the explosive device can be disconnected from the firing and monitoring circuitry. This allows for safe storage and easy replacement of the explosive section of the device.

In an alternative circuit arrangement as shown in FIG. 3, the transformer 1 of FIG. 1 is replaced by a radio-frequency filter comprising a choke 52 and a capacitor 53, one plate of which is grounded. In all other respects the FIG. 3 circuit configuration is identical to that of the FIG. 1 circuit, but different component values may be required because the circuit does not have the transformation ratio which is provided by the transformer 1 in the FIG. 1 embodiment. Furthermore, the practical form of the device will be somewhat different from that in the FIG. 2 embodiment, due to the absence of the transformer.

If a group of explosive devices is to be monitored, a plurality of fibre optics may be arranged to carry the information from the fuze circuits to a common receiver.

The light pulses fed from the LED 6 to the amplifier 27 may be passed through cooperating ports and/or may be reflected from surfaces, such that correct monitoring will be indicated only when certain safety, fuzing and arming mechanisms are in correct relative positions.

I claim:

1. An explosive device, comprising an explosive charge; an igniter circuit including an electrically-energisable heating element for igniting the explosive charge; a firing circuit operable to feed electrical energy to the igniter circuit at a firing level sufficient to cause ignition of the explosive charge; a light-emitting diode connected in series with the heating element; and a monitoring circuit operable to feed electrical energy to the igniter circuit at a level less than said firing level and to monitor radiant energy produced by said light-emitting diode in order to check the integrity of the igniter circuit.

2. An explosive device, comprising an explosive charge; an igniter circuit including an electrically-energisable heating element for igniting the explosive charge; a firing circuit operable to feed electrical energy to the igniter circuit at a firing level sufficient to cause ignition of the explosive charge; and a monitoring circuit including a capacitor which is chargeable from a direct current supply and which is dischargeable repeatedly via a field-effect transistor to provide pulses of electrical energy at a level less than said firing level, said monitoring circuit being operative to monitor radiant energy produced in the igniter circuit by said pulses of electrical energy in order to check the integrity of the igniter circuit.

3. A device as claimed in claim 2, wherein the monitoring circuit includes a timer circuit operative to monitor the timing of pulses of radiant energy produced in the igniter circuit in response to the pulses of electrical energy, and operative to operate an alarm if the timing is incorrect.

4. An explosive device, comprising an explosive charge; an igniter circuit including an electrically-energisable heating element for igniting the explosive charge; a firing circuit operable to feed electrical energy to the igniter circuit at a firing level sufficient to cause ignition of the explosive charge; a monitoring circuit operable to feed electrical energy to the igniter circuit at a level less than said firing level and to monitor radiant energy produced thereby in the igniter circuit in order to check the integrity of the igniter circuit; and a fibre optic to guide said radiant energy from said igniter circuit to said monitoring circuit.

5. A device as claimed in claim 4, wherein the igniter circuit is coupled to the firing circuit and to the monitoring circuit via a transformer having primary and secondary windings which are readily separable.

6. A device as claimed in claim 4, wherein the igniter circuit is coupled to the firing circuit and to the monitoring circuit via a radio-frequency filter.

* * * * *